(12) United States Patent
Cordani, Jr.

(10) Patent No.: US 7,704,562 B2
(45) Date of Patent: Apr. 27, 2010

(54) PROCESS FOR IMPROVING THE ADHESION OF POLYMERIC MATERIALS TO METAL SURFACES

(76) Inventor: John L. Cordani, Jr., 26 Richard Ave., Wolcott, CT (US) 06716

(*) Notice: Subject to any disclaimer, the term of this patent is extended or adjusted under 35 U.S.C. 154(b) by 627 days.

(21) Appl. No.: 11/503,780

(22) Filed: Aug. 14, 2006

(65) Prior Publication Data

US 2008/0038476 A1    Feb. 14, 2008

(51) Int. Cl.
*B05D 1/18* (2006.01)

(52) U.S. Cl. ............. 427/407.1; 427/443.1; 427/443.2; 427/437; 427/438; 148/253; 148/254; 148/255; 148/256

(58) Field of Classification Search ............... 427/407.1
See application file for complete search history.

(56) References Cited

U.S. PATENT DOCUMENTS

| | | | |
|---|---|---|---|
| 4,409,037 A | 10/1983 | Landau | |
| 4,642,161 A | 2/1987 | Akahoshi et al. | |
| 4,775,444 A | 10/1988 | Cordani | |
| 4,844,981 A | 7/1989 | Landau | |
| 4,902,551 A | 2/1990 | Nakaso et al. | |
| 4,981,560 A | 1/1991 | Kajihara et al. | |
| 4,997,516 A | 3/1991 | Adler | |
| 4,997,722 A | 3/1991 | Adler | |
| 5,067,990 A * | 11/1991 | Ribitch | 148/262 |
| 5,235,139 A | 8/1993 | Bengston | |
| 5,252,195 A | 10/1993 | Kobayashi et al. | |
| 5,288,377 A * | 2/1994 | Johnson et al. | 204/486 |
| 5,289,630 A | 3/1994 | Ferrier et al. | |
| 5,800,859 A | 9/1998 | Price et al. | |
| 6,403,168 B2 * | 6/2002 | Meyer et al. | 427/537 |
| 2004/0214029 A1 | 10/2004 | Carey et al. | |

FOREIGN PATENT DOCUMENTS

| | | |
|---|---|---|
| JP | 08-134661 | 5/1996 |
| WO | WO 96/19097 | 6/1996 |

OTHER PUBLICATIONS

An Alternate Route to Red Oxide for Inner Layers, Allan G. Osborne, Ph.D., PC FAB, Aug. 1984.

* cited by examiner

*Primary Examiner*—Michael Barr
*Assistant Examiner*—Ryan Schiro
(74) *Attorney, Agent, or Firm*—Carmody & Torrance LLP

(57) ABSTRACT

A process is disclosed for the purpose of increasing the adhesion of a polymeric material to a metal surface. The process comprises plating the metal surface with a layer of electroless nickel, electroless cobalt or electroless (or immersion) tin followed by phosphating the plated layer prior to bonding the polymeric material thereto. The process is particularly suited to treating printed circuit board inner-layers and lead frames.

17 Claims, No Drawings

PROCESS FOR IMPROVING THE ADHESION OF POLYMERIC MATERIALS TO METAL SURFACES

BACKGROUND OF THE INVENTION

The present invention relates to improving the adhesion between polymeric materials and metal surfaces. The invention is particularly suited to a process for fabricating a multilayer printed circuit or for encapsulating a lead frame.

Printed circuits containing one or more circuitry innerlayers are in prominent use today as demand increases for further and further weight and space conservation in electronic devices. In the typical fabrication of a multilayer printed circuit, patterned circuitry innerlayers are first prepared by a process in which a copper foil-clad dielectric substrate material is patterned with resist in the positive image of the desired circuitry pattern, followed by etching away of the exposed copper. Upon removal of the resist, there remains the desired copper circuitry pattern.

One or more circuitry innerlayers of any particular type or types of circuitry pattern, as well as circuitry innerlayers which might constitute ground planes and power planes, are assembled into a multilayer circuit by interposing one or more partially-cured dielectric substrate material layers (so-called "pre-preg" layers) between the circuitry innerlayers to form a composite of alternating circuitry innerlayers and dielectric substrate material. The composite is then subjected to heat and pressure to cure the partially-cured substrate material. The composite is then subjected to heat and pressure to cure the partially-cured substrate material and achieve bonding of circuitry innerlayers thereto. The so-cured composite will then have a number of through-holes drilled therethrough, which are then metallized to provide a means for conductively interconnecting circuitry layers. In the course of the through-hole metallizing process, desired circuitry patterns also typically will be formed on the outer-facing layers of the multilayer composite.

An alternate approach to the formation of a multilayer printed circuit board is through additive or surface laminar circuitry techniques. These techniques begin with a non-conductive substrate, upon which the circuit elements are additively plated. Further layers are achieved by repeatedly applying an imageable coating upon the circuitry and plating further circuit elements upon the imageable coating.

It has long been known that the strength of the adhesive bond formed between the copper metal of the circuitry innerlayers and the cured pre-preg layers, or other non-conductive coatings, in contact therewith leaves something to be desired, with the result that the cured multilayer composite or the coating is susceptible to delamination in subsequent processing and/or use. In response to this problem, the art developed the technique of forming on the copper surfaces of the circuitry innerlayers (before assembling them with pre-preg layers into a multilayer composite) a layer of copper oxide, such as by chemical oxidation of the copper surfaces. The earliest efforts in this regard (so-called "black oxide" adhesion promoters) produced somewhat minimal improvement in the bonding of the circuitry innerlayers to the dielectric substrate layers in the final multilayer circuit, as compared to that obtained without copper oxide provision. Subsequent variations on the black oxide technique included methods wherein there is first produced a black oxide coating on the copper surface, followed by post-treatment of the black oxide deposit with 15% sulfuric acid to produce a "red oxide" to serve as the adhesion promoter, such as disclosed by A. G. Osborne, "An Alternate Route To Red Oxide For Inner Layers", PC Fab. August 1984, as well as variations involving direct formation of red oxide adhesion promoter, with varying degrees of success being obtained. The most notable improvement in this art is represented in the U.S. Pat. Nos. 4,409,037 and 4,844,981 to Landau, the teachings both of which are included herein by reference in their entirety, involving oxides formed from relatively high chlorite/relatively low caustic copper oxidizing compositions, and producing substantially improved results in circuitry innerlayer adhesion.

As earlier noted, the assembled and cured multilayer circuit composite is provided with through-holes which then require metallization in order to serve as a means for conductive interconnection of the circuitry layers of the circuit. The metallizing of the through-holes involves steps of resin desmearing of the hole surfaces, catalytic activation, electroless copper depositing, electrolytic copper depositing, and the like. Many of these process steps involve the use of media, such as acids, which are capable of dissolving the copper oxide adhesion promoter coating on the circuitry innerlayer portions exposed at or near the through hole. The localized dissolution of the copper oxide, which is evidenced by formation around the through-hole of a pink ring or halo (owing to the pink color of the underlying copper metal thereby exposed), can in turn lead to localized delamination in the multilayer circuit.

The art is well aware of this "pink ring" phenomenon, and has expended extensive effort in seeking to arrive at a multilayer printed circuit fabrication process which is not susceptible to such localized delamination. One suggested approach has been to provide the adhesion promoting copper oxide as a thick coating so as to retard its dissolution in subsequent processing simply by virtue of sheer volume of copper oxide present. This turns out to be essentially counter-productive, however, because the thicker oxide coating is inherently less effective as an adhesion promoter. Other suggestions relating to optimization of the pressing/curing conditions for assembling the multilayer composite have met with only limited success.

Other approaches to this problem involve post-treatment of the copper oxide adhesion promoter coating prior to assembly of circuitry innerlayers and pre-preg layers into a multilayer composite. For example, U.S. Pat. No. 4,775,444 to Cordani discloses a process in which the copper surfaces of the circuitry innerlayers are first provided with a copper oxide coating and then contacted with an aqueous chromic acid solution before the circuitry innerlayers are incorporated into the multilayer assembly. The treatment serves to stabilize and/or protect the copper oxide coating from dissolution in the acidic media encountered in subsequent processing steps (e.g. through-hole metallization), thereby minimizing pink ring/delamination possibilities.

U.S. Pat. No. 4,642,161 to Akahoshi et al, U.S. Pat. No. 4,902,551 to Nakaso et al, and U.S. Pat. No. 4,981,560 to Kajihara et al, and a number of references cited therein, relate to processes in which the copper surfaces of the circuitry innerlayers, prior to incorporation of the circuitry innerlayers into a multilayer circuit assembly, are first treated to provide a surface coating of adhesion-promoting copper oxide. The copper oxide so formed is then reduced to metallic copper using particular reducing agents and conditions. As a consequence, the multilayer assembly employing such circuitry innerlayers will not evidence pink ring formation since there is no copper oxide present for localized dissolution, and localized exposure of underlying copper, in subsequent through-hole processing. As with other techniques, however, processes of this type are suspect in terms of the adhesion attainable between the dielectric substrate layers and the metallic copper circuitry innerlayers. This is particularly so in these reduction processes since the circuitry bonding surface not only is metallic copper, but also presents the metallic copper in distinct phases (i.e., (1) copper-from-reduction-of-copper oxide over (2) copper of the copper foil) which are prone to separation/delamination along the phase boundary.

U.S. Pat. Nos. 4,997,722 and 4,997,516 to Adler similarly involve formation of a copper oxide coating on the copper surface of circuitry innerlayers, followed by treatment with a specialized reducing solution to reduce the copper oxide to metallic copper. Certain portions of the copper oxide apparently may not be reduced all the way to metallic copper (being reduced instead to hydrous cuprous oxide or cuprous hydroxide), and those species are thereafter dissolved away in a non-oxidizing acid which does not attack or dissolve the portions already reduced to metallic copper. As such, the multi-layer assembly employing such circuitry innerlayers will not evidence pink ring formation since there is no copper oxide present for localized dissolution, and localized exposure of underlying copper, in subsequent through-hole processing. Here again, however, problems can arise in terms of the adhesion between the dielectric layers and metallic copper circuitry innerlayers, firstly because the bonding surface is metallic copper, and secondly because the metallic copper predominately is present in distinct phases (i.e., (1) copper-from-reduction-of-copper oxide over (2) copper of the copper foil), a situation prone to separation/delamination along the phase boundary.

U.S. Pat. No. 5,289,630 to Ferrier et al., the teachings of which are incorporated herein by reference in their entirety, reveals a process whereby an adhesion promoting layer of copper oxide is formed on the circuit elements followed by a controlled dissolution and removal of a substantial amount of the copper oxide in a manner which does not adversely affect the topography.

PCT Application No. WO 96/19097 to McGrath (and related U.S. Pat. No. 5,800,859), the teachings of which are incorporated by reference herein in their entirety, discusses a process for improving the adhesion of polymeric materials to a metal surface. The process discussed involves contacting the metal surface with an adhesion-promoting composition comprising hydrogen peroxide, an inorganic acid, a corrosion-inhibitor and a quaternary ammonium surfactant.

This invention proposes a process for improving the adhesion of polymeric materials to a metal surface, especially copper or copper alloy surfaces. The process proposed herein is particularly useful in the production of multilayer printed circuits. The process proposed herein provides optimum adhesion between the metallic and polymeric surfaces (i.e. the circuitry and the intermediate insulating layer), eliminates or minimizes pink ring and operates economically, all as compared to conventional processes.

SUMMARY OF THE INVENTION

The inventors herein propose a process for improving the adhesion of polymeric materials to metal surfaces, particularly copper and copper alloy surfaces. The proposed process comprises:
(1) contacting the metal surface with a plating solution selected from the group consisting of electroless nickel, electroless cobalt, electroless tin and immersion tin such that a material selected from the group consisting of nickel, cobalt and tin is plated on the metal surface to form a plated surface;
(2) contacting the plated surface with a phosphating composition such that a phosphate conversion coating is formed on the plated surface to form a phosphate conversion coated plated surface; and thereafter
(3) bonding the polymeric material to the phosphate conversion coated plated surface.

The inventors have found that the foregoing process greatly improves the adhesion of metal surfaces to polymeric materials even after repeated high temperature exposure. The process is particularly suited to treating copper or copper alloy metal surfaces such as are used in the manufacture of printed circuit boards, lead frames or chip carriers.

DETAILED DESCRIPTION OF THE INVENTION

The process proposed is intended for improving the adhesion between metal surfaces and polymeric materials. Applications for the process are widespread, but the process is particularly suited to increasing the adhesion between the copper layers of printed circuit boards and the polymeric pre-preg between the foregoing layers or for increasing the adhesion between copper lead frames and the encapsulating resins used to seal the lead frames. The proposed process comprises:
(1) optionally, but preferably, contacting a metal surface with a micro-etchant composition to etch and roughen the metal surface;
(2) contacting the metal surface with a plating solution selected from the group consisting of electroless nickel, electroless cobalt, immersion tin and electroless tin such that a material selected from the group consisting of nickel, cobalt and tin is plated on the metal surface to form a plated surface;
(3) contacting the plated surface with a phosphating composition such that a phosphate conversion coating is formed on the plated surface to form a phosphate conversion coated plated surface; and thereafter
(4) bonding the polymeric material to the phosphate conversion coated plated surface The process can be used upon any metal surface upon which nickel, cobalt or tin can be plated. In order to plate nickel or cobalt on some metal surfaces, it may be preferable to activate those surfaces with a precious metal activator prior to contacting the surfaces with the electroless nickel plating bath of this invention. In these cases, the metal surface is generally contacted with an activator solution comprising colloidal or ionic palladium, gold or silver after the optional microetch step but before the electroless step. The process is particularly suited to treating copper or copper alloy metal surfaces.

In the case where the metal surfaces comprise copper or copper alloys a precious metal activator may or may not be used depending upon the type of electroless bath used. Where the metal surfaces are copper or copper alloy, the choices are (i) use a precious metal activator before an electroless nickel (or cobalt) phosphorous bath, (ii) use a dimethylamino borane pre-dip before an electroless nickel (or cobalt) phosphorous bath, (iii) use a nickel (or cobalt) boron bath which does not require an activator, (iv) use an electroless or immersion tin bath without the need for an activator. In all of these cases an adherent and uniform deposit will be formed on the metal surface. The use of an immersion or electroless tin bath is particularly preferred when dealing with copper or copper alloy surfaces since no activator is necessary and the cost is relatively low.

Optionally, but preferably, the metal surface is microetched. In the case of copper or copper alloy metal surfaces, the microetch can comprise well known (i) peroxide-sulfuric microetches, (ii) cupric chloride microethes or (iii) persulfate microetches. In each case, it is preferable for the microetch to uniformly roughen the metal surface. This underlying surface roughness increases the magnitude and reliability of the subsequent bond. The time and temperature of the contact with the microetchant can be varied depending upon the type of microetchant being used and the characteristics of the metal surface with the goal being the attainment of a uniformly rough metal surface.

After microetching, but before contact with the plating bath, it may be necessary to activate the metal surface with a precious metal activator. A precious metal activator may be necessary if the metal surfaces comprise copper and the electroless nickel (or cobalt) bath to be used directly on the copper surface is a nickel (or cobalt) hypophosphite electroless bath. In this case, it is most preferable to use an ionic palladium activator such as a solution of palladium chloride at from about 10 to abut 500 ppm of palladium chloride. The purpose of the activator is to coat the metal surface with catalytic precious metal sites which are capable of initiating the subsequent electroless plating. As noted previously, electroless nickel boron baths and electroless or immersion tin baths do not require an activator when plating on copper or copper alloys.

The metal surface, whether activated or not, is contacted with a plating bath selected from the group consisting of electroless nickel, electroless cobalt, electroless tin and immersion tin, preferably for a time and at a temperature sufficient to plate from about 2 to 50 microinches of metal. The electroless nickel (or cobalt) bath can be of the electroless nickel (or cobalt)-phosphorous (i.e. nickel (or cobalt)/sodium hypophosphite) type or it can be of the nickel (or cobalt)-boron (i.e. nickel/dimethyl amino borane type or nickel (or cobalt)/sodium borohydride type). For cost, reliability and environmental safety, it is preferable to use an electroless nickel-phosphorus bath or an immersion (or electroless) tin bath. However, if an electroless nickel-phosphorus bath is used, it is important that the concentration of phosphorous in the nickel deposit be controlled to relatively low levels. Preferably the electroless nickel (or cobalt) phosphorous deposit has less than 6 weight percent phosphorous, most preferably less than 3 weight percent phosphorous. Most preferably, in the case of printed circuits, the electroless nickel step will comprise (i) an electroless nickel-boron strike to create a very thin nickel layer which can be plated upon by a nickel-phosphorous bath without activation, followed by (ii) an electroless nickel-phosphorous bath without any need for precious metal activation of the metal surface. Another preferable alternative is using an electroless or immersion tin bath. A typical electroless nickel-boron bath useful in this invention is as follows:

| COMPONENT | CONCENTRATION (g/l) |
| --- | --- |
| Nickel Sulfate hexahydrate | 4.9 |
| Malic Acid | 2.6 |
| DMAB | 1.18 |
| Glycine | 3.8 |
| Water | remainder | pH = 4.9

A typical low phosphorous electroless nickel-phosphorous bath useful in this invention is as follows:

| COMPONENT | CONCENTRATION (G/L) |
| --- | --- |
| Nickel (from Nickel Sulfate) | 6.0 |
| Sodium Hypophosphite | 45 |
| Lead (from Lead Acetate) | 1.2 ppm |
| Thiourea | 3 ppm |

Total nickel thickness to be plated on the metal surface is preferably from 5 to 25 microinches.

If electroless or immersion tin is chosen and the metal surface comprises copper, the tin will effectively plate on the copper surfaces without activation. Typically electroless or immersion tin baths comprise (i) stannous ions, (ii) a solubilizing acid such as fluoboric acid or methane sulfonic acid and (iii) thiourea. A useful immersion tin formulation is:

| COMPONENT | CONCENTRATION (G/L) |
| --- | --- |
| Fluoboric Acid | 275 |
| Stannous Fluoborate | 6 |
| Thiourea | 80 |
| Tartaric Acid | 35 |

The invention has surprisingly found that excellent and uniform phosphate conversion coatings can be formed on immersion (or electroless) tin surfaces, as well as electroless nickel (or cobalt) surfaces if the phosphorous content of the nickel or cobalt surfaces is low (i.e. less than 10% by weight, preferably less than 6% by weight and most preferably less than 3% by weight.

Next, the plated metal surface is contacted with a phosphate conversion coating composition such that a phosphate conversion coating is created on the plated surface. Preferably, the phosphate conversion coating is a zinc-phosphate conversion coating. In order for the phosphate conversion coating to effectively form on the plated surface, the phosphate bath must attack the plated surface. The inventors have found that high concentrations of phosphorous in the electroless nickel (or cobalt) deposit (above about 10 weight percent) will inhibit the effective formation of a good phosphate conversion coating. A typical and preferred composition for the phosphate conversion coating bath is as follows:

| COMPONENT | CONCENTRATION (g/l) |
| --- | --- |
| Phosphoric Acid (75%) | 362 |
| Zinc Oxide | 14.65 |
| Calcium carbonate | 0.5 |
| Nitric Acid | 213.3 |
| Nickel Sulfate | 7.35 |
| Sodium Biflouride | 10.39 |
| Sodium Nitrate | 21.4 |
| Water | remainder |

The foregoing concentrate is diluted to 7% by volume with water.

Contact time and temperature in the phosphate bath may vary but contact time is preferably from about 1 to 10 minutes and temperature is preferably from 90° F. to 160° F.

Typically the phosphate conversion coating composition will comprise (i) phosphoric acid, (ii) nitric acid and fluoride ions. Preferably the phosphate composition comprises zinc ions. In this regard, please refer to U.S. Pat. No. 4,838,957 to Miyamoto, the disclosure of which is incorporated herein by reference in its entirety. Preferably, the phosphate composition also comprises a nitrite compound, most preferably a nitrite salt.

After application of the phosphate conversion coating, the surface is dried and can then be effectively bonded to a polymeric material. In the case of printed circuit boards the copper or copper alloy circuit traces and features are treated with the process of this invention and then laminated with polymeric materials to form multilayer circuit boards. In the case of lead frames or chip carriers, the lead frame or chip carrier is treated or partially treated with the process of this invention and subsequently encapsulated with a polymeric material.

The invention is further described, without limitation, by the following examples:

EXAMPLE I

A piece of copper foil and a piece of copper clad laminate were processed in the following manner:
(1) Microetched for 3 minutes at 100° F. in a microetchant solution comprising cupric chloride.
(2) Rinse.
(3) Activated for 1 minute at 100° F. in a 55 ppm solution of palladium chloride.
(4) Plated with electroless nickel in the following composition at 160° F. for 1 minute:

| COMPONENT | CONCENTRATION (G/L) |
| --- | --- |
| Nickel (from Nickel Sulfate) | 6.0 |
| Sodium Hypophospate | 45 |
| Lead (from Lead acetate) | 1.2 ppm |
| Thiourea | 3 ppm |

(5) Rinse.
(6) Dry.

The foil was then laminated to the Copper clad laminate using heat and pressure by interleaving several sheets of partially cured pre-preg. One inch wide strips of the foil were then peel tested with the following results:

| Adhesion lb/in. | Seconds at 550° F. |
| --- | --- |
| 6.8 | 0 |
| 6.6 | 30 |
| 6.5 | 60 |

I claim:

1. A process for increasing the adhesion of a polymeric material to a metal surface, said process comprising:
 a. optionally, contacting the metal surface with a microetchant;
 b. contacting the metal surface with a plating solution selected from the group consisting of electroless nickel-phosphorous plating solutions and electroless nickel-boron plating solutions such that a material selected from the group consisting of nickel-phosphorous and nickel-boron is plated onto the metal surface to form a plated surface;
 c. contacting the plated surface with a phosphating composition, such that a phosphate conversion coating is formed on the plated surface, to form a phosphate conversion coated plated surface; and thereafter
 d. bonding a polymeric material to the phosphate conversion coated plated surface;
wherein the metal surface comprises copper.

2. A process according to claim 1 wherein the polymeric material comprises epoxy.

3. A process according to claim 1 wherein the microetchant is used and wherein the microetchant comprises cupric chloride.

4. A process according to claim 1, wherein the plated surface comprises less than 6 weight percent phosphorous prior to contact with the phosphate composition.

5. A process according to claim 1 wherein the plated surface comprises less than 3 weight percent phosphorous prior to contact wit the phosphate composition.

6. A process according to claim 1 wherein step (b) comprises contacting the metal surface with an electroless nickel-boron solution followed by contact with an electroless nickel-phosphorous solution.

7. A process according to claim 1 wherein the phosphating composition compnses zinc ions.

8. A process according to claim 2 wherein the nickel plated surface comprises less than 6 weight percent phosphorous prior to contact with the phosphate composition.

9. A process according to claim 2 wherein the nickel plated surface comprises less than 3 weight percent phosphorous prior to contact with the phosphate composition.

10. A process according to claim 2 wherein step (b) comprises contacting the metal surface with an electroless nickel-boron solution followed by contact with an electroless nickel-phosphorous solution.

11. A process according to claim 2 wherein the phosphating composition comprises zinc ions.

12. A process according to claim 8 wherein the microetchant is used and wherein the microetchant comprises cupric chloride.

13. A process according to claim 8 wherein step (b) comprises contacting the metal surface with an electroless nickel-boron solution followed by contact with an electroless nickel-phosphorous solution.

14. A process according to claim 8 wherein the phosphating composition comprises zinc ions.

15. A process according to claim 9 wherein the microetchant is used and wherein the microetchant comprises cupric chloride.

16. A process according to claim 9 wherein step (b) comprises contacting the metal surface with an electroless nickel-boron solution followed by contact with an electroless nickel-phosphorous solution.

17. A process according to claim 9 wherein the phosphating composition comprises zinc ions.

* * * * *

UNITED STATES PATENT AND TRADEMARK OFFICE
CERTIFICATE OF CORRECTION

| | | |
|---|---|---|
| PATENT NO. | : 7,704,562 B2 | Page 1 of 1 |
| APPLICATION NO. | : 11/503780 | |
| DATED | : April 27, 2010 | |
| INVENTOR(S) | : John L. Cordani, Jr. | |

It is certified that error appears in the above-identified patent and that said Letters Patent is hereby corrected as shown below:

Column 8

Line 28, delete "compnses" and replace it with --comprises--

Signed and Sealed this

Eighth Day of June, 2010

David J. Kappos
*Director of the United States Patent and Trademark Office*